(12) United States Patent
Culp et al.

(10) Patent No.: US 9,832,875 B2
(45) Date of Patent: Nov. 28, 2017

(54) METHOD FOR MANUFACTURING LAYERED ELECTRONIC DEVICES

(71) Applicant: Hamilton Sundstrand Corporation, Charlotte, NC (US)

(72) Inventors: Slade R. Culp, Coventry, CT (US); Sameh Dardona, South Windsor, CT (US); Wayde R. Schmidt, Pomfret Center, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 372 days.

(21) Appl. No.: 14/333,856

(22) Filed: Jul. 17, 2014

(65) Prior Publication Data

US 2016/0007462 A1 Jan. 7, 2016

Related U.S. Application Data

(60) Provisional application No. 62/021,571, filed on Jul. 7, 2014.

(51) Int. Cl.
*H05K 1/16* (2006.01)
*C23C 18/16* (2006.01)
(Continued)

(52) U.S. Cl.
CPC .............. *H05K 1/16* (2013.01); *B32B 37/06* (2013.01); *C23C 18/1633* (2013.01); *H05K 1/0298* (2013.01); *H05K 1/092* (2013.01); *H05K 1/165* (2013.01); *H05K 3/12* (2013.01); *H05K 3/36* (2013.01); *H05K 3/4617* (2013.01);
(Continued)

(58) Field of Classification Search
CPC .. H05K 3/00; H05K 3/10; H05K 3/30; H05K 1/0298; H05K 1/092; H05K 1/16; H05K 1/165; H05K 3/12; H05K 3/36; H05K 3/4617; H05K 2201/0125; H05K 2201/0129; H05K 2203/06; H05K 2203/1105; B32B 37/06; B32B 2305/72; C23C 18/1633
See application file for complete search history.

(56) References Cited

U.S. PATENT DOCUMENTS 5,322,594 A * 6/1994 Bol ..................... B41J 2/14072
216/18
2003/0146019 A1 8/2003 Hirai
(Continued)

FOREIGN PATENT DOCUMENTS

EP 2367407 A1 9/2011
GB 2180102 A 3/1987

OTHER PUBLICATIONS

Extended European Search Report for European Patent Application No. 15173294.8, dated Dec. 9, 2015.

*Primary Examiner* — Carl Arbes
(74) *Attorney, Agent, or Firm* — Locke Lord LLP; Scott D. Wofsy; Joshua L. Jones

(57) ABSTRACT

A method for fabricating printed electronics includes printing a trace of an electrical component on a first substrate to form a first layer. The method further includes printing a trace of an electrical component on at least one additional substrate to form at least one additional layer. The first layer is stacked with the at least one additional layer to create an assembled electrical device. At least one of the layers is modified after printing.

11 Claims, 2 Drawing Sheets

(51) Int. Cl.
*B32B 37/06* (2006.01)
*H05K 3/12* (2006.01)
*H05K 3/36* (2006.01)
*H05K 1/02* (2006.01)
*H05K 1/09* (2006.01)
*H05K 3/46* (2006.01)

(52) U.S. Cl.
CPC .. *B32B 2305/72* (2013.01); *H05K 2201/0125* (2013.01); *H05K 2201/0129* (2013.01); *H05K 2203/06* (2013.01); *H05K 2203/1105* (2013.01)

(56) References Cited

U.S. PATENT DOCUMENTS

| | | |
|---|---|---|
| 2005/0136231 A1 | 6/2005 | Voss-Kehl et al. |
| 2010/0112199 A1 | 5/2010 | McClure et al. |

* cited by examiner

METHOD FOR MANUFACTURING LAYERED ELECTRONIC DEVICES

CROSS-REFERENCE TO RELATED APPLICATIONS

This application claims the benefit of priority to U.S. Provisional Patent Application No. 62/021,571 filed Jul. 7, 2014 which is incorporated by reference herein in its entirety.

BACKGROUND OF THE INVENTION

1. Field of the Invention

The present disclosure relates to electronic devices, and more particularly to printed electronic devices.

2. Description of Related Art

Electromagnetic (EM) devices such as motors, inductors, sensors, etc. are often manufactured using lamination and winding or etching of electrical conductors. The materials in the assembly are selected for specific properties, for example, electrical or thermal conductivity, dielectric strength, and magnetic permeability. The three dimensional organization of these materials is critical for optimization of device performance.

With conventional methods, EM devices having optimal designs are often not easily manufacturable. Performance is then sacrificed due to processing constraints. Most recently additive manufacturing (AM) has been used to manufacture EM devices. AM methods significantly reduce the manufacturing design constraints for EM devices. However, preliminary explorations of conventional AM for EM devices have yet to find effective methods to fully integrate electrical function with mechanical structure. Beyond relaxing design constraints, direct printed electronics also bring the potential for significant cost reduction due to the inherent capability with roll-to-roll, lamination and other high volume manufacturing methods. A method to leverage flexibility of direct printed electronics, high volume three dimensional assembly, and materials selection for optimized performance, structural integrity, and encapsulation is desired.

Such conventional methods have generally been considered satisfactory for their intended purpose. However, there is still a need in the art for improved system for manufacturing printed electromagnetic devices. The present disclosure provides a solution for this need.

SUMMARY OF THE INVENTION

A method for fabricating printed electronics includes printing a trace of an electrical component on a first substrate to form a first layer. The method further includes printing a trace of an electrical component on at least one additional substrate to form at least one additional layer. The first layer is stacked with the at least one additional layer to create an assembled electrical device. At least one of the layers is modified after printing. Printing can include printing the first layer of the assembled electrical device including multiple electrical components with varying electrical functionalities.

The trace of the electrical component can be at least one of electrically conductive, semiconductive, or insulating/dielectric material. The printed material can be at least one of an ink, paste, slurry, dispersion, solution or a powder.

The first layer and the at least one additional layer can be stacked together. Stacking of the layers may include vertical stacking of each layer or rolling each layer together. In addition, stacking can include interconnecting the layers with an electrical connectivity therebetween.

The substrate can be modified in varying manners based on the electrical device. For example, the individual layers may be shrunk to a target size by heating the substrate at a predetermined temperature for a predetermined duration based on properties of the substrates prior to stacking. The stacked layers can be modified by shrinking the stacked layers to a target size by heating the substrate at a predetermined temperature for a predetermined duration based on properties of the substrate. The substrates can also be modified by curing, cutting, embossing, stamping, plating and/or etching and the like.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
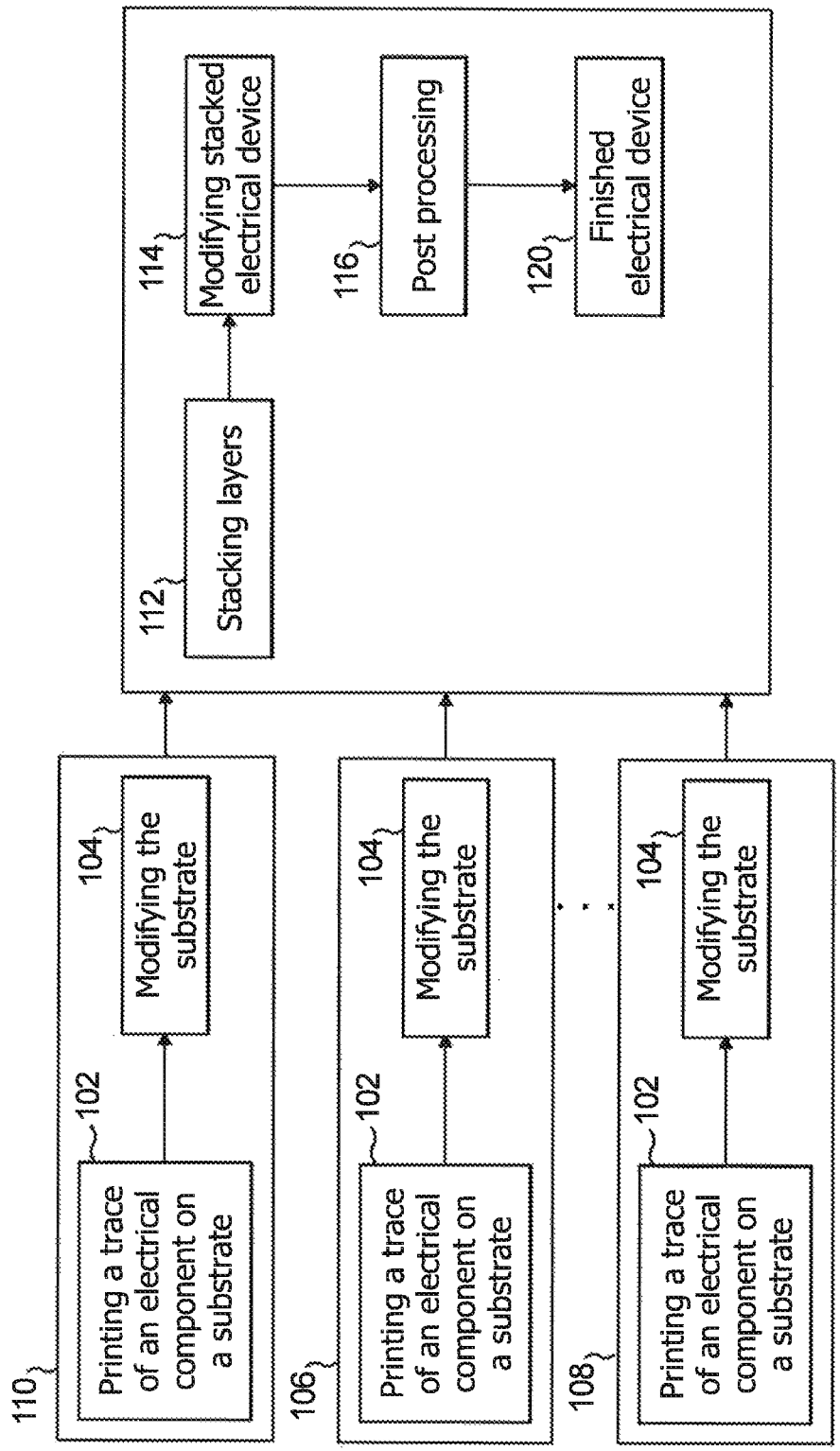
FIG. 1 is a flow chart of an exemplary embodiment of a method in accordance with the present disclosure, showing processes for printing, modifying and layering printed electrical devices.

Reference will now be made to the drawings wherein like reference numerals identify similar structural features or aspects of the subject disclosure. For purposes of explanation and illustration, and not limitation, a partial view of an exemplary embodiment of the method of manufacturing printed electronic devices in accordance with the disclosure is shown in FIG. 1 and is designated generally by reference character 100. Other embodiments of methods in accordance with the disclosure, or aspects thereof, are provided in FIGS. 2-3, as will be described.

One limitation of traditional techniques of using additive manufacturing to manufacture printed electromagnetic devices is the inability to create structures that differ substantially in size, functionality, and accuracy and yet can also provide the needed material diversity wherein the materials have acceptable properties in comparison to other forming techniques. This is particularly true when attempting to create multicomponent structures in the 3D printing process. For instance, to create a circuit board, both a good electrical conductor and a good nonconductor or insulator are required in a pattern.

FIG. 1 illustrates a method 100 in accordance with the present disclosure for a 3D printing process that effectively manufactures a multicomponent structure while adhering to individual property characteristics and provides improved size compared to traditional techniques. The method 100 begins with printing a trace of an electrical component on a substrate at box 102. The substrate can belong to the electroactive polymers family, for example, dielectric elastomers. Polystyrene is just one example of a family of 'heat shrinkable' materials that are suitable as substrates for use with the methods disclosed herein. Other examples of suitable materials include but are not limited to thermoplastics such as polyolefins, fluoropolymers (e.g. fluorinated ethylene propylene (FEP), polytetrafluoroethylene (PTFE), Kynar, Viton and the like), neoprene, silicone, polyvinylchloride (PVC), and the like. Any other suitable materials can be used without departing from the scope of this disclosure. The electrical component can include at least one of an electrically conductive, semiconductive, or insulating material. Further, the printed trace can be comprised of a metal based ink, paste, slurry, dispersion, solution or a powder.

At box 104, the substrate is modified to create a first layer 110 of an electrical device 120. The substrate can be modified in varying manners based on the electrical device. For example, the substrate may be shrunk to a target size by heating the substrate at a predetermined temperature for a predetermined duration based on properties of the substrate. The substrate can also be modified by curing, cutting, embossing, stamping, plating and/or etching and the like. A subsequent layer or additional layers are created in the same manner at boxes 106 and 108. Although two additional layers are indicated in FIG. 1, it is to be understood that any suitable number of layers can be used to manufacture the electrical device. For a multicomponent device, this can include additional layers each pertaining to individual electrical components or additional layers with portions of each electrical component embedded therein.

After all the layers are individually created, the first layer 110 and at least one additional layer 106 are assembled or stacked together as shown in box 112. Assembling or stacking the individual layers in this manner allows for printed electronic devices with multiple electronic components for various functionalities. As will be noted, electrical component as used and described in the present disclosure includes but is not limited to resistors, capacitors, inductors, transistors, and diodes. Electrical device, as used and described in the present disclosure, includes a device having one or more electrical components. For example, chemical sensors, radiation sensors, environmental sensors, light emitting structures, integrated motor coils with embedded sensors and smoke detectors.

Figure 2:
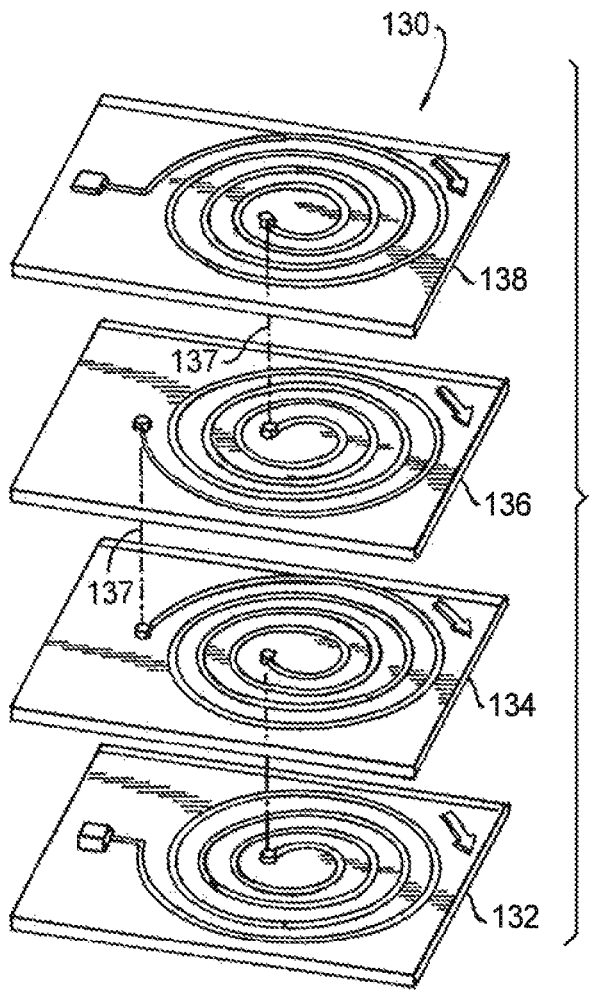
FIG. 2 is an exploded view of an exemplary embodiment of a printed three dimensional electromagnetic coil according to FIG. 1, schematically showing vertical stacking and interconnectors.

Stacking of the layers may include vertical stacking of each layer. If the substrates are flexible, the stacked layers can be rolled into a cylinder or other 3D form, as needed. In addition, stacking can include interconnecting the layers with an electrical connectivity therebetween. For example, FIG. 2 illustrates a printed three-dimensional coil 130 manufactured with four layers 132, 134, 136, 138. Through at least three of the layers an electrical interconnector 137 is positioned so as to connect the electrical functionality of each of the four layers 132, 134, 136, 138.

Modification of the stacked layers may be completed after stacking as needed for specific applications as shown in box 114. For example, the stacked layers can be shrunk to a target size by heating the substrate at a predetermined temperature for a predetermined duration based on properties of the substrate. Shrinking the layers before and/or after stacking them together provides a multicomponent electrical device that meets design specification for micro, meso and nano-sized circuits. For example, an electrical component such as an inductor may be shrunk to less than about 50% of the original size. Similarly, an electrical device such as a sensor using the described method may be shrunk to less than about 50% of the original size.

It is also contemplated that the stacked layers can be modified by curing, cutting, embossing, stamping, plating and/or etching and the like. The electrical device can then go through post-processing which can include heat treating, coating, trimming, encapsulating or the like as in box 116. With the method 100 as shown and described above, a layered electrical device 120 is manufactured using additive manufacturing while including multiple electrical components and sustaining a desired size.

Figure 3:
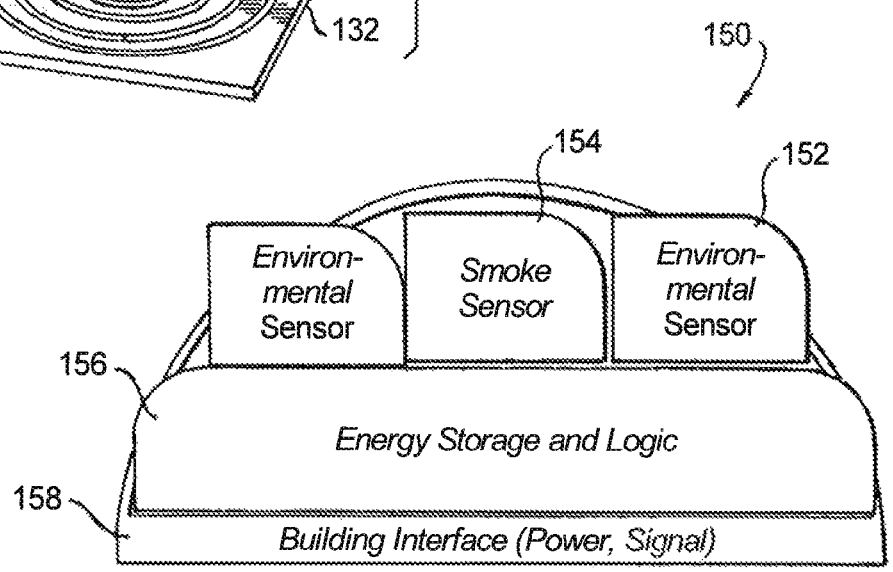
FIG. 3 is a schematic view of another exemplary printed and integrated device according to FIG. 1, showing multiple electrical and optical components layered as a single electrical device.

FIG. 3 illustrates an exemplary embodiment of an electronic device 150 that can be manufactured with the methods as described herein. The electronic device 150 is a room sensory system with multiple components such as an environmental sensor 152 and a smoke sensor 154. These individual sensors 152, 154 are assembled together with an energy storage and logic component 156. For example a processor and memory can be included in logic component 156. This can be used to alert room occupants as needed based on environmental factors sensed from the sensors 152, 154. The components 152, 154, 156 are all electrically connected to a building interface 158 which may supply power to the sensory system 150. As will be understood the sensory system 150 is just one example of an electrical device 120 that can be manufactured with the method 100 as described.

The disclosure has been shown and described using direct write printing but is applicable to a wide variety of methods, including, but not limited to, ink jet printing, aerosol printing, screen printing, plasma spray, ultrasonic dispensing, micro cold spray and the like. Those skilled in the art will readily appreciate that any other suitable deposition process can be used without departing from the scope of the disclosure.

The methods and systems of the present disclosure, as described above and shown in the drawings, provide for manufacturing a layered electrical device with superior properties including multiple electrical functionalities while maintaining mechanical structure. While the apparatus and methods of the subject disclosure have been shown and described with reference to preferred embodiments, those skilled in the art will readily appreciate that changes and/or modifications may be made thereto without departing from the spirit and scope of the subject disclosure.

What is claimed is:

1. A method for fabricating printed electronics:
    printing a trace of an electrical component on a first substrate to form a first layer;
    printing a trace of an electrical component on at least one additional substrate to form at least one additional layer; and
    stacking the first layer with the at least one additional layer to create an assembled electrical device, wherein at least one of the layers is modified after printing, wherein modifying includes shrinking at least one of the layers from an original size to a target size where the target size is less than the original size.

2. The method of claim 1, wherein the trace of the electrical component is at least one of electrically conductive, semiconductive, or insulating material.

3. The method of claim 2, wherein the printed material is at least one of an ink, paste, slurry, dispersion, solution or a powder.

4. The method of claim 1, wherein printing includes printing the first layer of the electrical device including multiple electrical components with varying electrical functionalities.

5. The method of claim 1, wherein modifying includes shrinking the substrates for the first layer and the at least one additional layer to a target size prior to stacking by heating the substrates at a predetermined temperature for a predetermined duration based on properties of the substrates.

6. The method of claim 1, further including shrinking the assembled electrical device to a target size by heating the assembled electrical device at a predetermined temperature for a predetermined duration based on properties of the substrates.

7. The method of claim 1, further including shrinking the substrates for the first layer and the at least one additional layer to a target size prior to stacking by heating the substrates at a predetermined temperature for a predetermined duration based on properties of the substrates and shrinking the assembled electrical device to a target size by heating the assembled electrical device at a predetermined temperature for a predetermined duration based on properties of the substrates.

8. The method of claim 1, wherein modifying includes curing, cutting, embossing, stamping, plating and/or etching the substrate.

9. The method of claim 1, wherein stacking includes rolling the first layer and the at least one additional layer.

10. The method of claim 1, wherein stacking includes vertical layering of the first layer and the at least one additional layer, wherein vertical layering includes placing the at least one additional layer on top of the first layer.

11. The method of claim 1, wherein stacking includes positioning vertical interconnectors between at least two different layers.

* * * * *